United States Patent [19]
Anderson

[11] Patent Number: 5,953,386
[45] Date of Patent: *Sep. 14, 1999

[54] HIGH SPEED CLOCK RECOVERY CIRCUIT USING COMPLIMENTARY DIVIDERS

[75] Inventor: Michael B. Anderson, Colorado Springs, Colo.

[73] Assignee: LSI Logic Corporation, Milpitas, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/667,150

[22] Filed: Jun. 20, 1996

[51] Int. Cl.[6] ................................ H03D 3/24; H03L 7/06
[52] U.S. Cl. .................... 375/376; 327/156; 327/157; 331/25
[58] Field of Search ..................... 375/376, 215, 375/294, 359, 327; 327/156, 157, 147, 148; 331/11, 25; 455/260

[56] References Cited

U.S. PATENT DOCUMENTS

| | | |
|---|---|---|
| 4,773,085 | 9/1988 | Cordell ................................ 375/376 |
| 5,028,887 | 7/1991 | Gilmore ................................ 331/25 |
| 5,115,450 | 5/1992 | Arcuri ................................ 375/219 |
| 5,315,269 | 5/1994 | Fujii ................................ 331/11 |
| 5,321,369 | 6/1994 | Wolaver ................................ 327/3 |
| 5,455,540 | 10/1995 | Williams ................................ 375/376 |
| 5,483,558 | 1/1996 | Leon et al. ................................ 375/376 |
| 5,506,627 | 4/1996 | Ciardi ................................ 348/536 |
| 5,550,515 | 8/1996 | Liang et al. ................................ 331/11 |
| 5,621,755 | 4/1997 | Bella et al. ................................ 375/376 |
| 5,822,387 | 10/1998 | Mar ................................ 375/376 |

*Primary Examiner*—Stephen Chin
*Assistant Examiner*—Betsy L. Deppe
*Attorney, Agent, or Firm*—Wayne P. Bailey; Duke W. Yee

[57] ABSTRACT

A phase-locked loop circuit including a divider unit that receives a serial data stream at its input and generates a parallel data stream. The parallel data stream has a slower clock rate than the serial data stream according to the present invention. A phase detector unit has an input connected to the output of the divider unit for receiving the parallel data stream generated by the divider unit. The phase-locked loop circuit further includes a voltage controlled oscillator having an input connected to the output of the phase detector unit. The output of the voltage controlled oscillator is connected to another input of the phase detector, wherein the phase detector unit generates error signals that are sent to the voltage controlled oscillator.

16 Claims, 13 Drawing Sheets

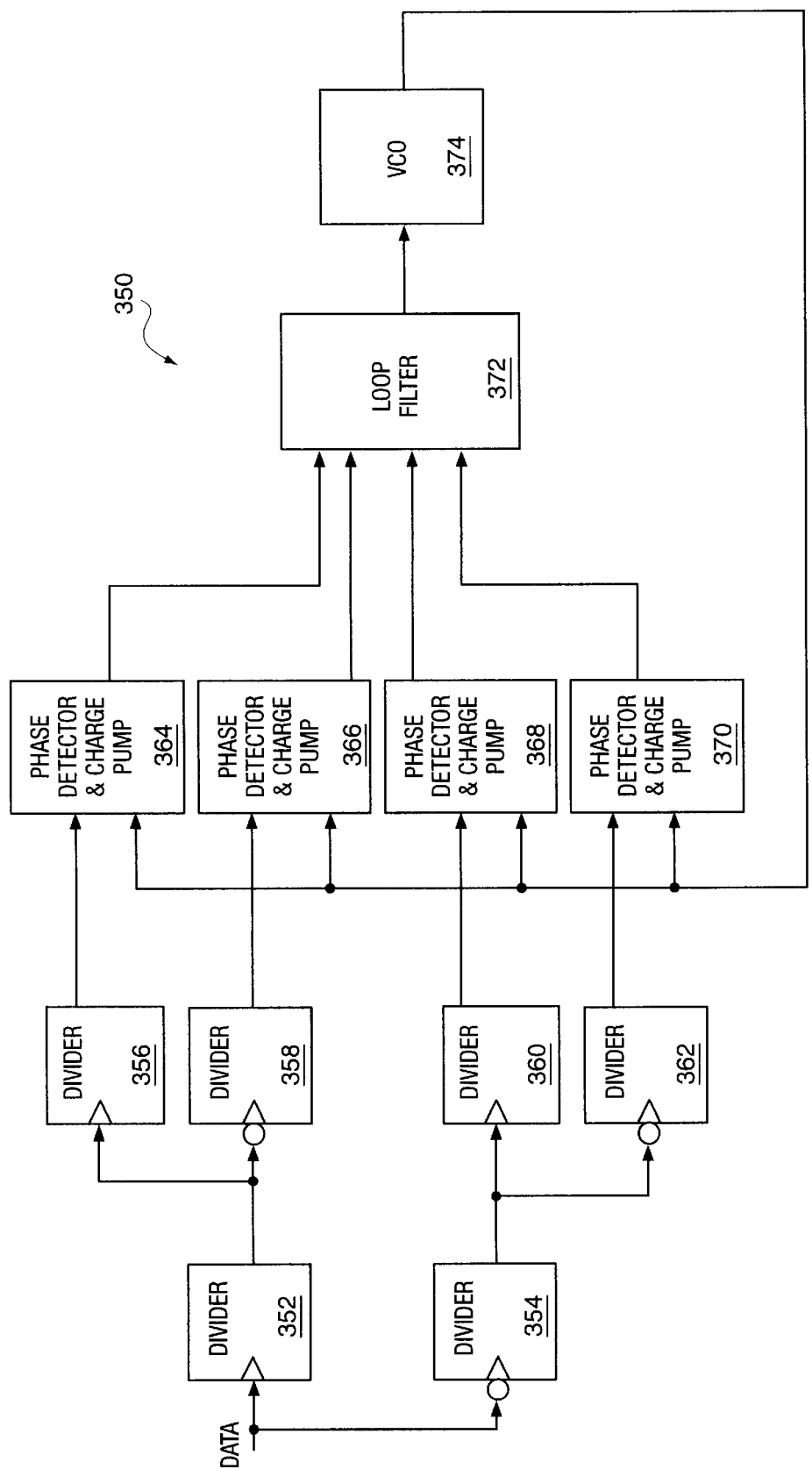

HIGH SPEED CLOCK RECOVERY CIRCUIT USING COMPLIMENTARY DIVIDERS

BACKGROUND OF THE INVENTION

1. Technical Field

The present invention relates generally to data transmissions and in particular to serial data transmissions. Still more particularly, the present invention is related to an improved clock recovery system using a phase-locked loop circuit in a serial data transmission system.

2. Description of the Related Art

As serial communication speeds increased to one gigabit (Gbit) and beyond, process technologies for creating devices to meet those speeds are pushed to their limits. To compete with inherently faster technologies, alternative design techniques are required. For example, with a clock recovery circuit employing a phase-locked loop (PLL), recovery of a one Gbit data stream using traditional approaches requires all of the components of the clock recovery PLL to operate at one GHz. Generating devices operating at these frequencies can lead to lower yields of devices.

Traditionally, computers transfer data over wide, bulky, parallel cables or over slow RS232 serial buses. New technologies and the need for faster data transfers has prompted the development of a new type of serial data communication. Presently available serial technologies transfer data at much faster rates than existing parallel standards, such as small computer systems interface (SCSI). For example, SCSI data rates are presently at 20 MBaud per second. Fiber channel provides data rates of 100 MBaud per second.

To successfully provide 100 MBaud per second over a serial link with relatively slow technologies, such as complimentary metal oxide semiconductor (CMOS), new design techniques are required.

Therefore, it would be advantageous to have an improved method and apparatus for transferring serial data without requiring all components in a device to operate at the speed of the serial data stream.

SUMMARY OF THE INVENTION

The present invention provides a phase-locked loop circuit including a divider unit that receives a serial data stream at its input and generates a parallel data stream such that no data edges are lost. Preserving data edges allows a phase detector in a phase-locked loop circuit to extract an optimal error signal to control a voltage controlled oscillator. The parallel data stream has a slower clock rate than the serial data stream according to the present invention. A phase detector unit has an input connected to the output of the divider unit for receiving the parallel data stream generated by the divider unit. The phase-locked loop circuit further includes a voltage controlled oscillator having an input connected to the output of the phase detector unit. The output of the voltage controlled oscillator is connected to another input of the phase detector, wherein the phase detector unit generates error signals that are sent to the voltage controlled oscillator.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIGS. 3A–3D are block diagrams of PLL's depicted according to the present invention;

DETAILED DESCRIPTION

Figure 1:
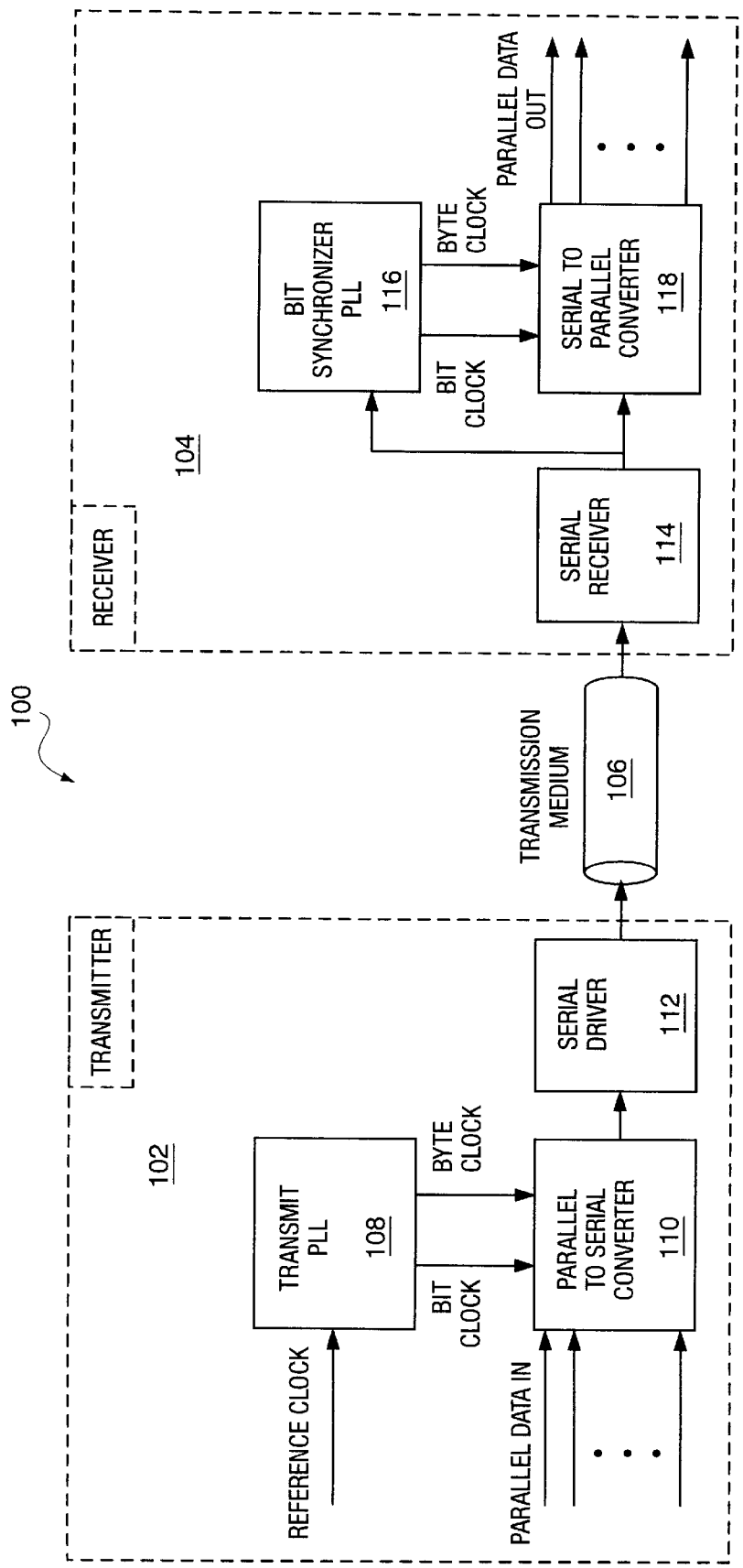
FIG. 1 is a serial data transmission system depicted according to the present invention.

With reference now to the figures, and in particular with reference to FIG. 1, a serial data transmission system is depicted according to the present invention. Serial data transmission system 100 includes a transmitter 102 connected to a receiver 104 by transmission medium 106. Transmitter 102 includes a transmit PLL 108, a parallel to serial converter 110, and a serial driver 112. Transmit PLL 108 receives a reference clock to produce a bit clock and a byte clock for converting parallel data received by parallel serial converter 110 into serial data, which is then transmitted by serial driver 112 across transmission medium 106 to receiver 104. Receiver 104 includes a serial receiver 114, a bit synchronizer PLL 116, and a serial to parallel converter 118. Bit synchronizer PLL 116 receives the serial data stream from serial receiver 114 to recover a bit clock and a byte clock for converting the serial data stream received by serial receiver 114 from transmission medium 106 into parallel data using serial to parallel converter 118.

Figure 2:
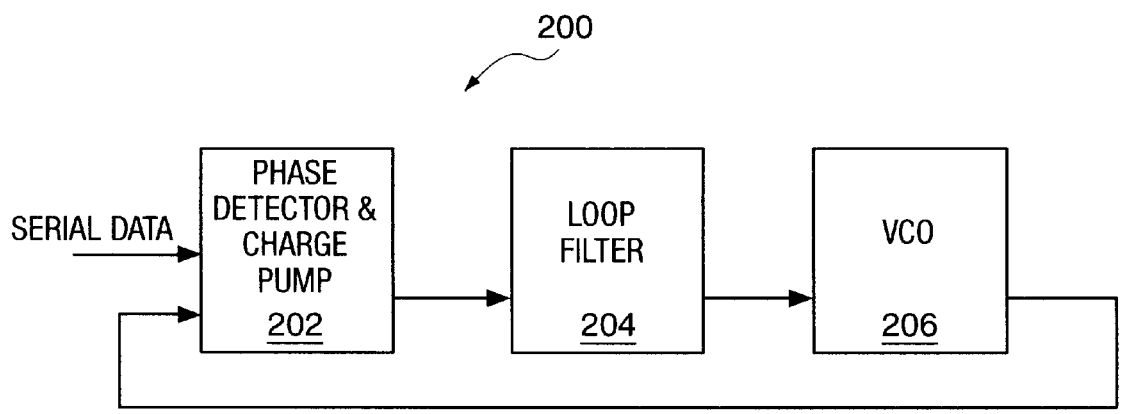
FIG. 2 is a block diagram of a typical phase-locked loop (PLL) circuit.

With reference now to FIG. 2, a block diagram of PLL is depicted. PLL 200 includes a phase detector and charge pump 202, a loop filter 204, and a voltage control (VCO) 206. PLL 200 is the type of PLL typically implemented for bit synchronizer 116 in FIG. 1. With PLL 200, the serial data stream is input into phase detector and charge pump 202, with the serial data stream being filtered by loop filter 204 and the filter data stream being compared to a clock from VCO 206. An error signal is generated in the phase detector portion of phase detector and charge pump 202. This error signal is then filtered and fed back to VCO 206. In this way, PLL 200 continuously updates the phase error and corrects for any phase difference on every edge of the serial data stream. In PLL 200, phase detector and charge pump 202, loop filter 204, and VCO 206 all operate at the same speed as the serial data stream. For data streams having a rate of more than one gigabit, CMOS technologies would be limited from competing with other technologies.

According to the present invention, data stream may be deserialized and sent through multiple phase detectors and charge pumps such that the phase detector, charge pump, and VCO could operate at a lower frequency while continuously updating any phase error from each data edge, according to the present invention. Under such a system, all data edges are used to update the PLL. Thus, requiring all of the PLL components to run at the same speed may be avoided by converting the serial data into parallel data, which is then used as an input into the PLL. Using the parallel data for phase lock allows the components of the PLL to work together at lower speeds. Additionally, according to the present invention, a parallel approach is employed to deserialize the serial data stream opposed to the use of multiplexors or shift registers. According to the present invention, complementary dividers are used to reduce the data rate to simplify the use of sampling.

With reference now to FIGS. 3A–3D, diagrams of PLL's are illustrated according to the present invention. The PLL circuits depicted in FIGS. 3A and 3B employ only a single charge pump with multiple phase detectors while the PLL circuits depicted in FIGS. 3C and 3D employ multiple phase detector and charge pump units.

Figure 3A:
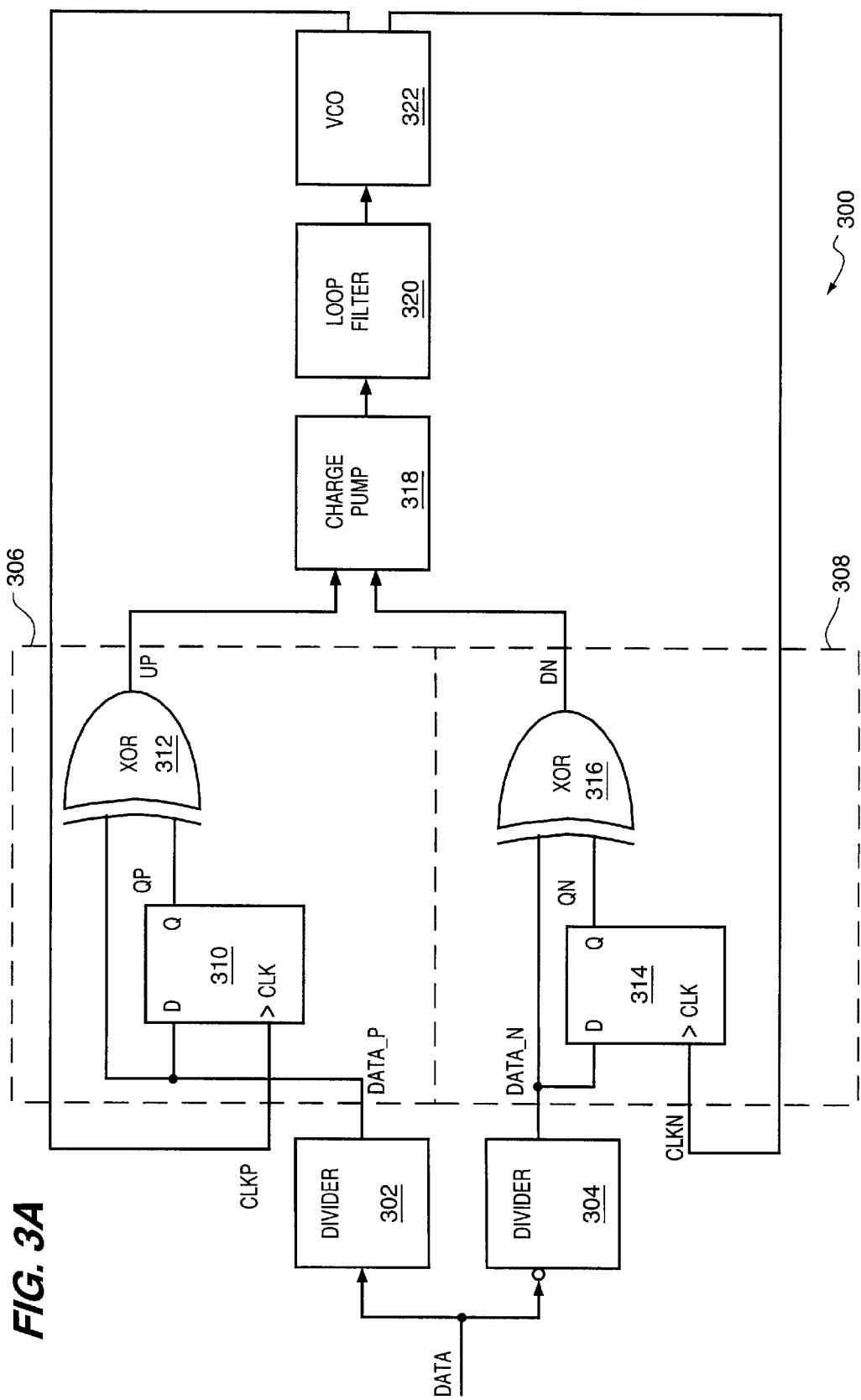

With reference first to FIG. 3A, a block diagram of a PLL 300 is depicted according to the present invention. PLL 300 has a single level of division, which divides the speed of the data signals by one-half. PLL 300 includes a divider 302 and a divider 304, which are connected to phase detector circuits 306 and 308. Divider 302 is a positive edge divider while divider 304 is a negative edge divider. In other words, divider 302 is a complimentary divider to divider 304. Complimentary division ensures that no data edges will be lost. Phase detector circuit 306 includes a D-flip flop 310 and an XOR gate 312. Similarly, phase detector 308 includes a D-flip flop 314 and an XOR gate 316. The outputs of phase detectors 306 and 308 are connected to charge pump 318, which in turn is connected to loop filter 320. The output of loop filter 320 is connected to VCO 322. The output of VCO 322 is connected to phase detectors 306 and 308 at the clock input of D-flip flops 310 and 314 in the depicted example.

A signal DATA is input into dividers 302 and 304, resulting in signals DATA_P and DATA_N. These signals are sent into D-flip flops 310 and 314. The data is clocked by signals CLKP and CLKN. The resulting output from D-flip flops 310 and 314 are signals QP and QN. The resulting signal from XOR gates 312 and 316 are signals UP and DN, which are sent into charge pump 318. In PLL 300, signals DATA_P and DATA_N have a clock rate that is half of signal data.

Figure 3B:
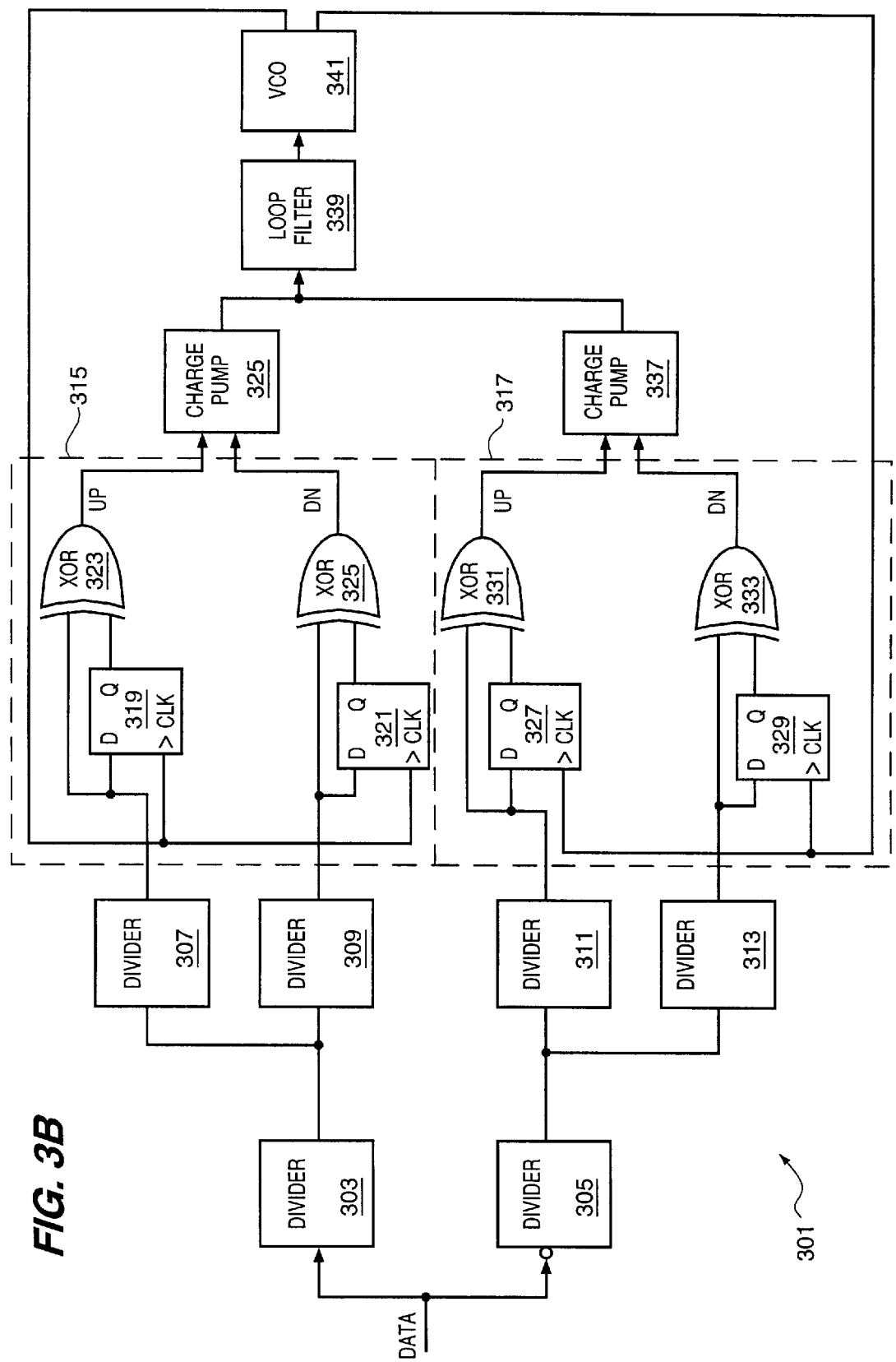

With reference now to FIG. 3B, a PLL 301 is depicted according to the present invention. PLL 301 includes two levels of division, which results in a signal that has one-quarter the rate of the input signal. A signal DATA is sent into dividers 303 and 305, which performs a first level of division decreasing the rate of signal DATA by one-half. Divider 303 is a positive edge divider, and divider 305 is a negative edge divider. PLL 301 also includes dividers 307, 309, 311, and 313, with dividers 307 and 311 being positive edge dividers and dividers 309 and 313 being negative dividers. These dividers form a second level of division, reducing the rate of the data signal from dividers 303 and 305 to one-fourth that of signal DATA. The output of dividers 307 and 309 are sent into phase detector 315 while the output of dividers 311 and 313 are sent into phase detector 317. Phase detector 315 includes a D-flip flop 319, D-flip flop 321, XOR gate 323, and XOR gate 325. Similarly, phase detector 317 includes D-flip flop 327, D-flip flop 329, XOR gate 331, and XOR gate 333. The outputs of the XOR gates are connected to charge pumps 335 and 337, which are in turn connected to loop filter 339. VCO 341 receives signals from loop filter 339 and generates an output that is sent back to phase detectors 315 and 317. The output from VCO 341 is used as clock signals in the D-flip flops in these phase detectors.

Figure 3C:
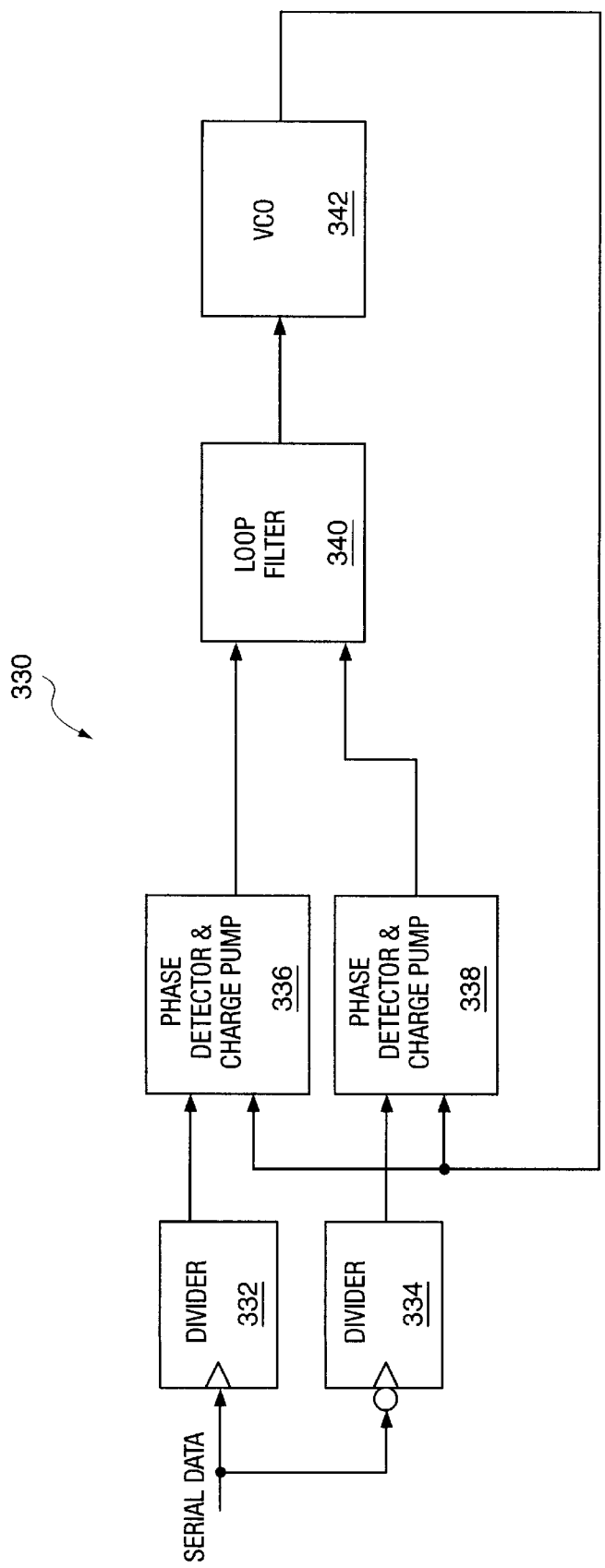

Turning next to FIG. 3C, a PLL 330 is depicted according to the present invention. In this example, the serial data stream is split into two parallel data streams. In particular, the serial data stream is deserialized by dividing this serial data stream by two.

PLL 330 includes a divider 332 and a divider 334 in which divider 334 is a complementary divider to divider 332 with divider 332 being a positive edge divider and divider 334 being a negative edge divider in the depicted example. PLL 330 also includes phase detector and charge pumps 336 and 338. Phase detector and charge pump 336 is connected to divider 332 while phase detector and charge pump 338 is connected to divider 334. The output from both phase detector and charge pump 336 and 338 are input into loop filter 340 according to the present invention. Loop filter 340 sums the output from phase detector and charge pumps 336 and 338. The output of loop filter 340 is connected to the input of VCO 342 according to the present invention. The output for VCO 342 is connected to phase detector and charge pump 336 and phase detector and charge pump 338.

Although phase detector and charge pump 336 and 338 are depicted as a single unit, each block contains a phase detector and a charge pump with the phase detector being used to generate error signals when data is compared from a clock from VCO 342. With the use of complementary dividers, such as divider 332 and divider 334, no data edges are lost. The deserialized data from dividers 332 and 334 is then compared to the clock signal from VCO 342 at the phase detector within phase detector and charge pump 336 and phase detector and charge pump 338 to generate an error signal with the signals being summed at loop filter 340 according to the present invention.

In FIG. 3C, with the data being in a parallel form, phase detector and charge pumps 336 and 338 and VCO 342 can be run at half the frequency of the serial data stream. Alternatively, VCO 342 could be run at the rate of the serial data stream using a divider. According to the present invention, only divider 332 and divider 334 need to be designed to run at the rate of the serial data stream while the rest of the circuit can run at slower speeds.

With reference now to FIG. 3D, a PLL 350 is depicted according to the present invention. PLL 350 includes dividers 352 and 354, which are cascaded with dividers 356, 358, 360, and 362 according to the present invention. Dividers 356 and 360 are positive edge dividers while dividers 358 and 362 are negative edge dividers in the depicted example. Dividers 356, 358, 360 and 362 have their outputs connected to the phase detectors and charge pumps 364, 366, 368, and 370, respectively. The outputs of these charges pumps are summed at loop filter 372 with the output being sent to VCO 374 according to the present invention. Again as with PLL 350, no data edges are lost (e.g., the original serial data stream can be reconstructed by XORing the complementary pairs from the outputs of the dividers back together). The phase detectors, charge pumps, loop filters, and VCO may be run at speeds that are one-fourth that of the dividers of PLL 350 according to the present invention. Although the depicted example illustrates dividing the data stream into two and four parallel data streams, the method and apparatus of the present invention can be used to divide a data stream into N parallel data streams with an N factor reduction of the clock rate of the parallel data streams, resulting in the same reduction of the VCO clock.

Figure 4:
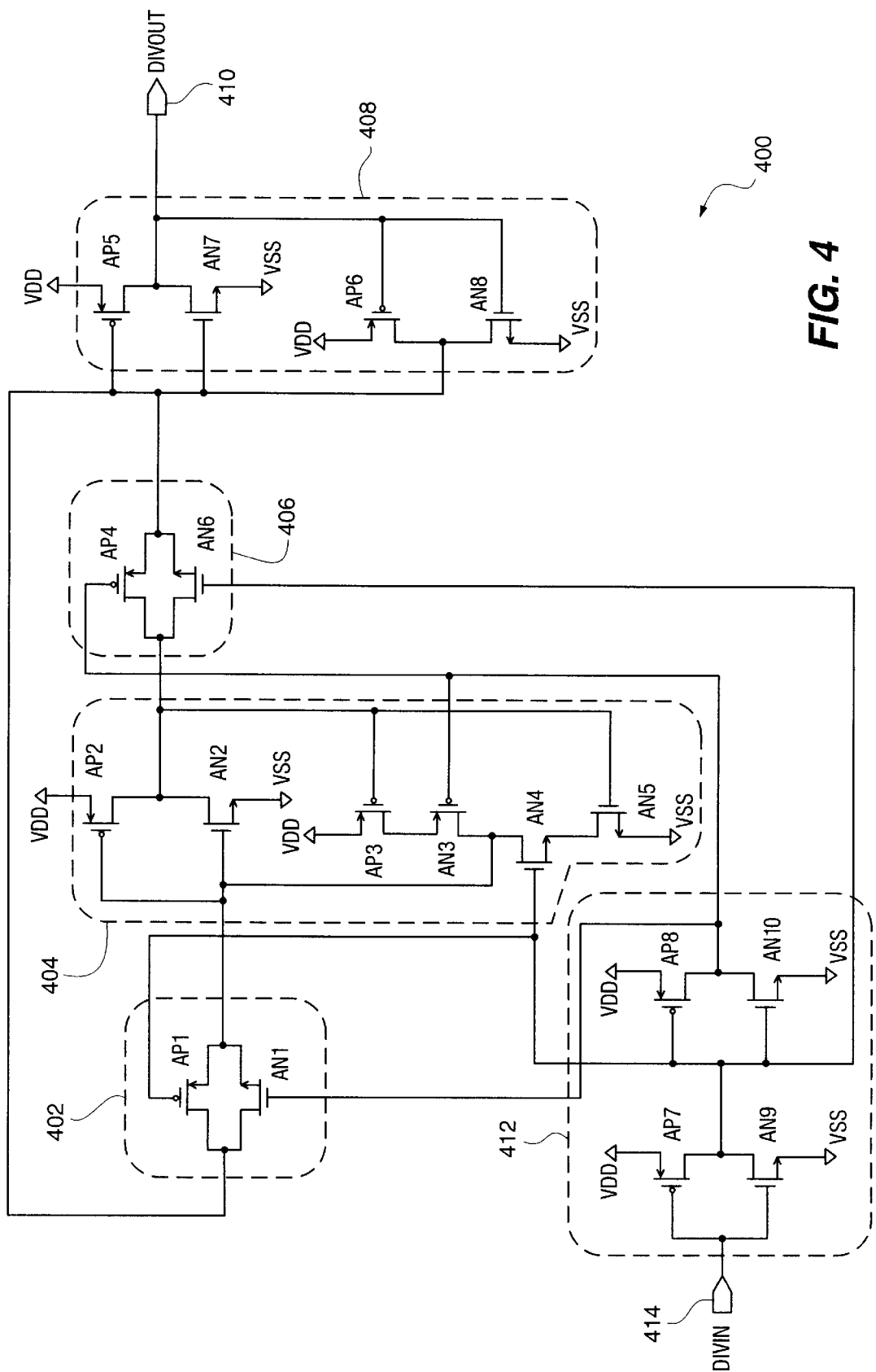
FIG. 4 is a schematic diagram of a positive edge divider depicted according to the present invention.

With reference now to FIG. 4, a schematic diagram of a positive edge divider, such as divider 302 in FIG. 3A, is depicted according to the present invention. Divider 400 contains transistors AP1–AP8, which are P-type metal oxide semiconductor (PMOS) transistors, and transistors AN1–AN10, which are N-type metal oxide semiconductor transistors (NMOS) transistors in the depicted example. Transistors AP1 and AN1 form a transfer gate 402. Transistors AP2–AP3, and AN2–AN5 form input latch 404 in divider 400. Transistors AP4 and AN6 form a transfer gate 406. Output latch 408 contains transistors AP5, AP6, AN7, and AN8. Output latch provides output signals at output 410. Clock buffer 412 contains transistors AP7, AP8, AN9, and AN10. Clock buffer 412 drives the other components within divider 400 in response to signals at input 414.

Figure 5:
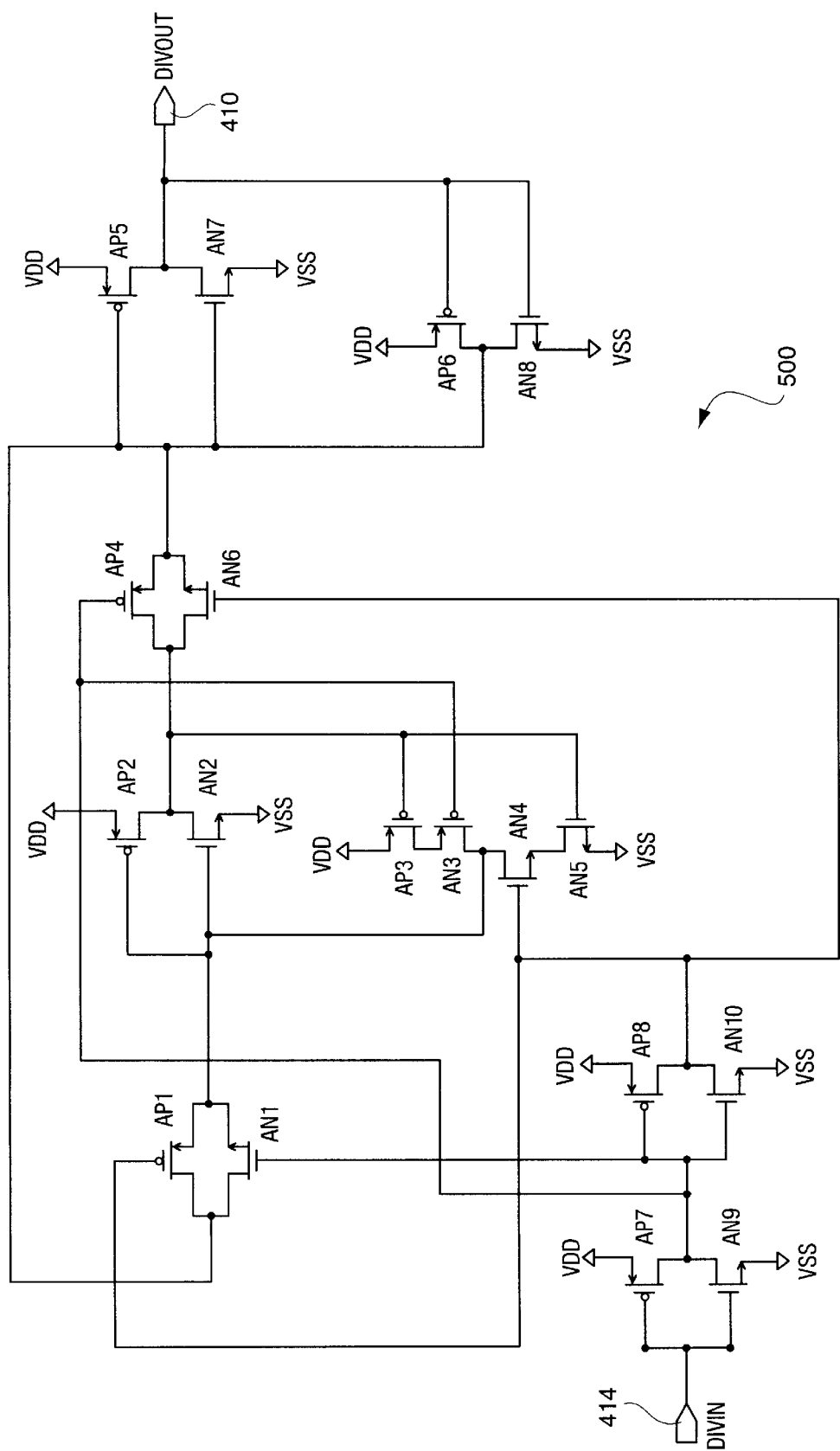
FIG. 5 is a schematic diagram of a negative edge divider circuit according to the present invention.

With reference now to FIG. 5, a schematic diagram of a negative edge divider, such as divider 304 in FIG. 3A is depicted according to the present invention. The same exact components are used in divider 500 as with divider 400, except that the connections from the clock buffer to the other components of the divider are reversed from FIG. 4.

Figure 6:
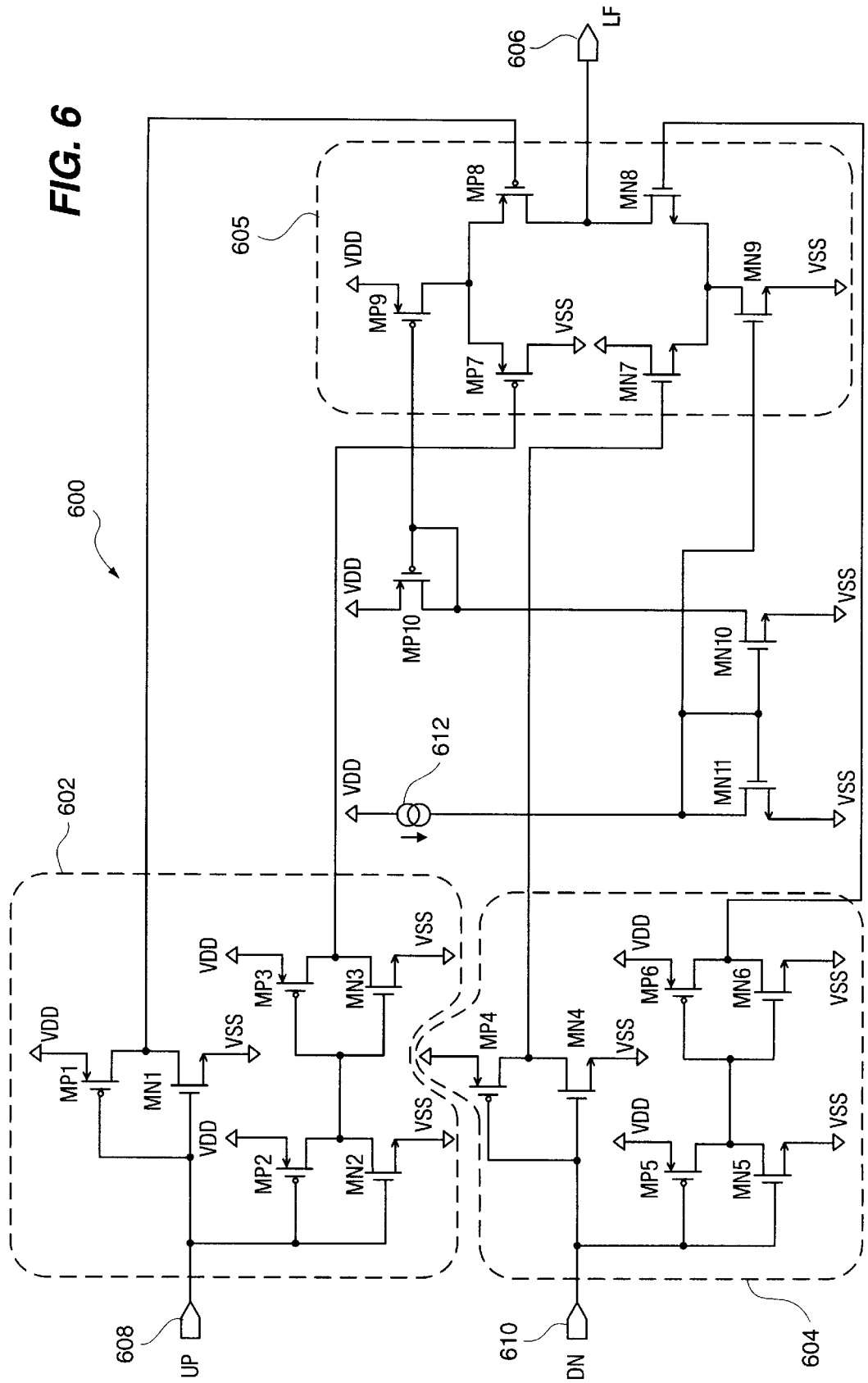
FIG. 6 is a schematic diagram of a charge pump depicted according to the present invention.

In FIG. 6, a schematic diagram of a charge pump is depicted according to the present invention. Charge pump 600 includes transistors MP1–MP10, which are PMOS transistors, and transistors MN1–MN11, which are NMOS transistors in the depicted example. Transistors MP1–MP3 and MN1–MN3 form complimentary output unit 602 while transistors MP4–MP6 and MN4–MN6 form complimentary output unit 604. Transistors MN11 and MN10 form a current mirror; transistors MP10 and MP9 also form a current mirror. Transistors MP7–MP9 and MN7–MN9 form an output unit 605, which provides an output signal at output 606 in response to signals sent into charge pump 600 at inputs 608 and 610. Charge pump 600 also includes a fixed current source 612. Complimentary output units 602 and 604 each contain three inverters, which are used to generate complimentary outputs in response to an input into the circuit. In the depicted example, input 608 receives a signal UP while input 610 receives a signal DN from a pair of XOR gates in a phase detector, such as phase detector 315 or 317 in FIG. 3A.

Figure 7A:
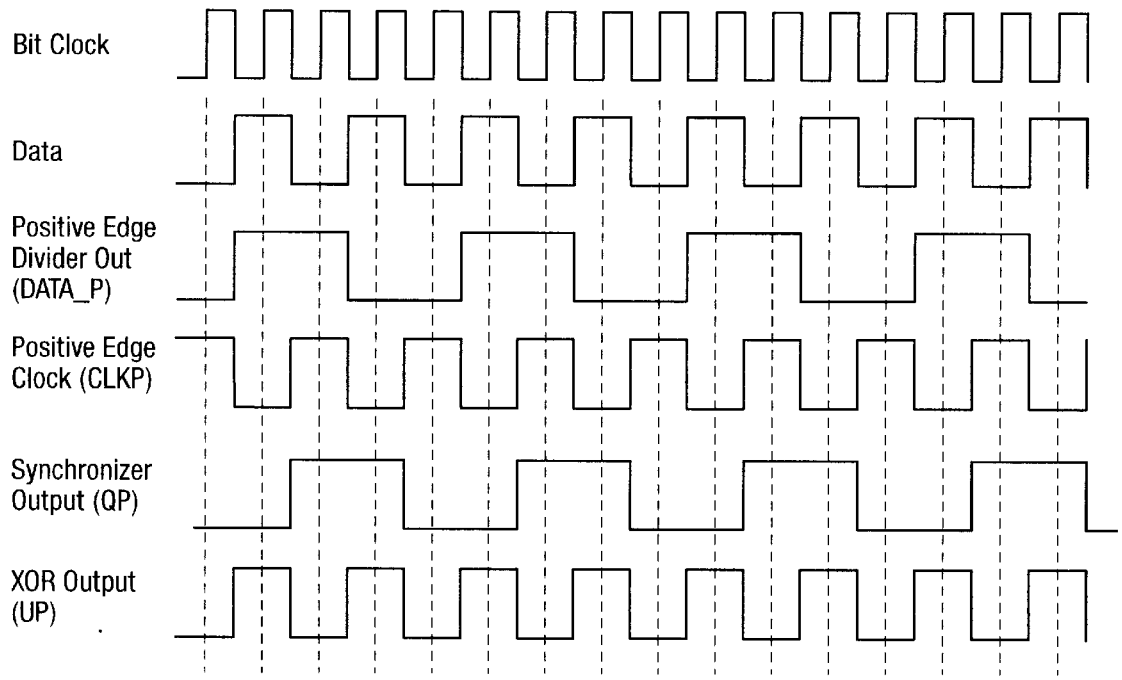
FIGS. 7A and 7B are timing diagrams of a phase detector with high transition data in a locked state according to the present invention.
Figure 7B:
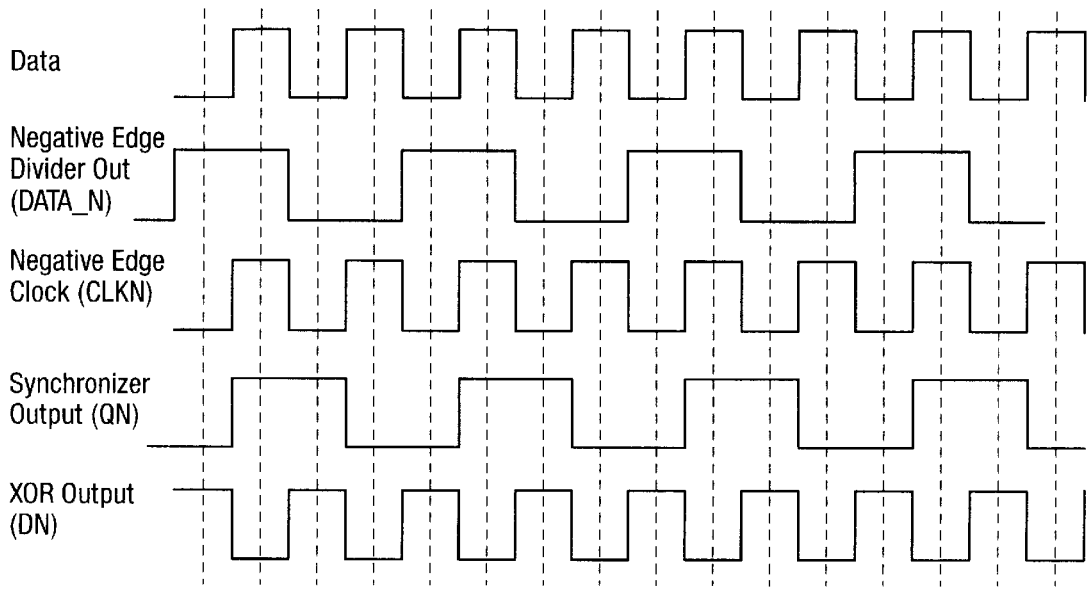

The timing diagrams in FIGS. 7A–7B, 8A–8B, and 9A–9B are generated from PLL 300 in FIG. 3A, and the signals correspond to those described with respect to FIG. 3A. FIGS. 7A and 7B are timing diagrams of a phase detector with high transition data in a locked state according to the present invention. In FIG. 7A, the timing diagram illustrates the case in which maximum data transitions occur and the loop is locked to the data. The optimal data sampling point is in the middle of the bit time as shown by dotted vertical lines. The positive edge divider output is shown with the positive edge clock. The XOR gate output is operating at a fifty percent duty cycle waveform when in the locked position. The second half of the waveforms are shown in FIG. 7B, which correspond to the negative divider feedback path. Again, the XOR output is a fifty percent duty cycle waveform.

Figure 8A:
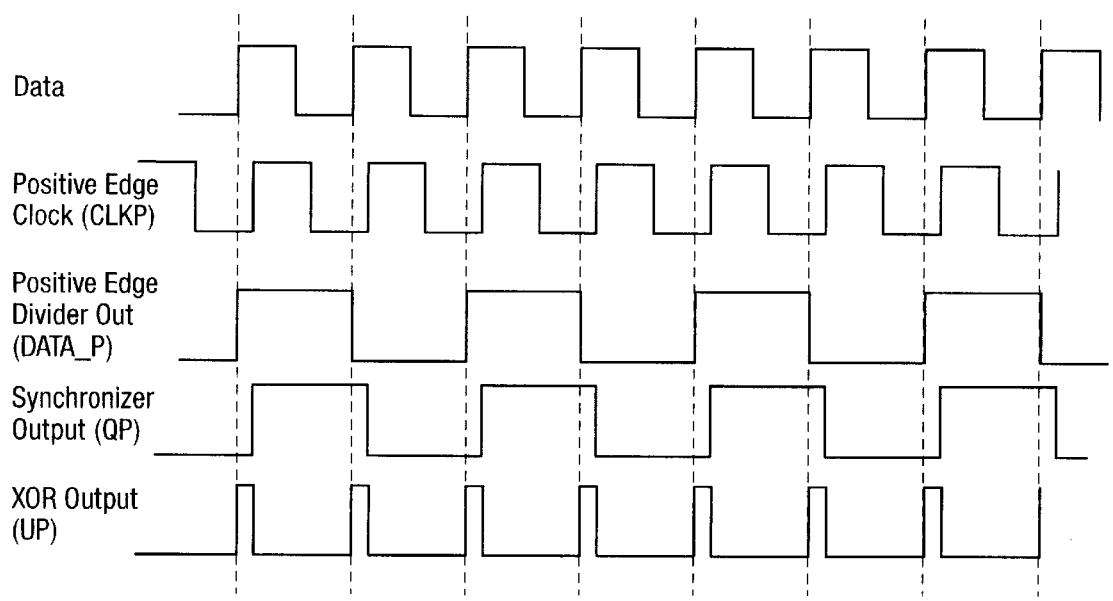
FIGS. 8A and 8B are timing diagrams of phase leading in which the charge pump increases charge according to the present invention.
Figure 8B:
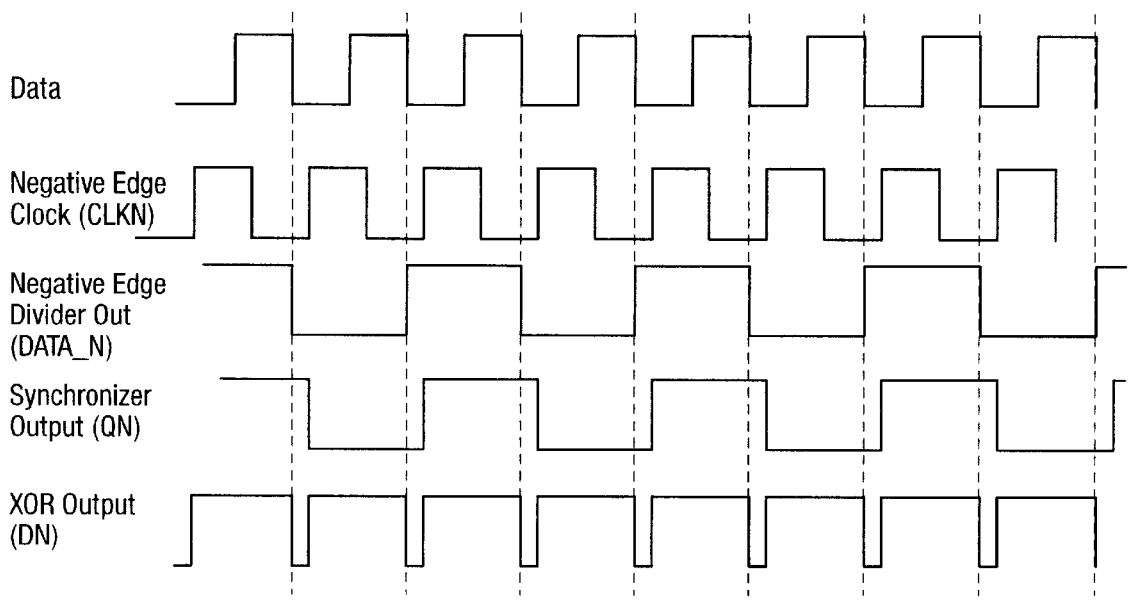

Two fifty percent duty cycle UP and DN pulses will on average cancel each other, leaving a net charge difference of zero. PLL 300 is designed such that if a phase lag is encountered between the clocks and data, the UP signal will increase in duty cycle to greater than fifty percent and the DN signal will decrease to a less than fifty percent duty cycle. With reference to FIGS. 8A and 8B, timing diagrams of phase leading in which the charge pump increases charge are depicted according to the present invention. As can be seen in FIGS. 8A and 8B, the dotted vertical lines illustrate the data edge. The change in duty cycle will increase the amount of charge that is pumped into a loop filter, thus adjusting the VCO appropriately to track data.

Figure 9A:
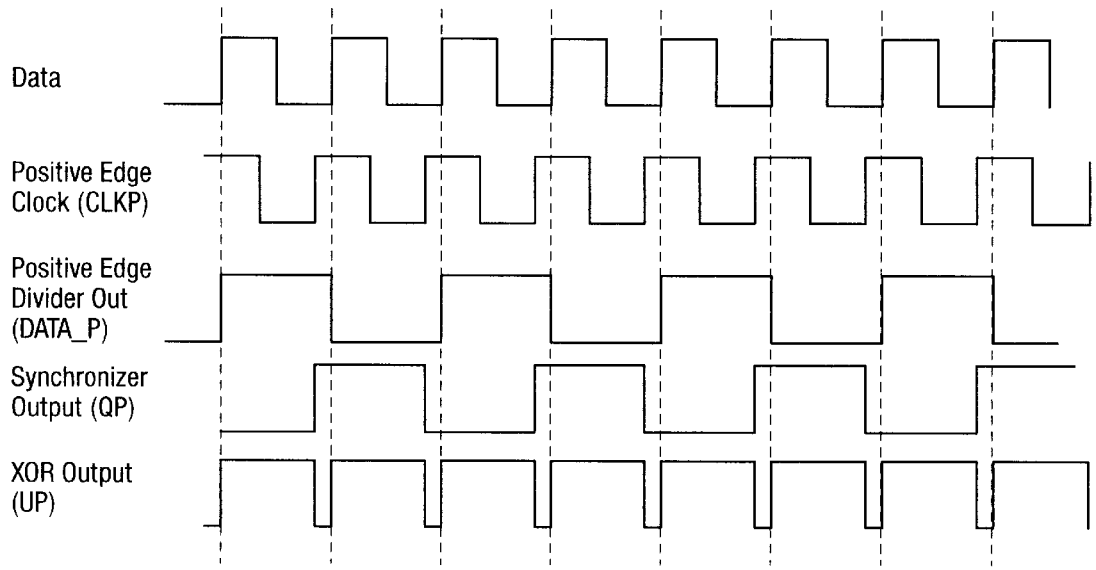
FIGS. 9A and 9B timing diagrams of phase lag are illustrated in which a charge pump decreases charge according to the present invention.
Figure 9B:
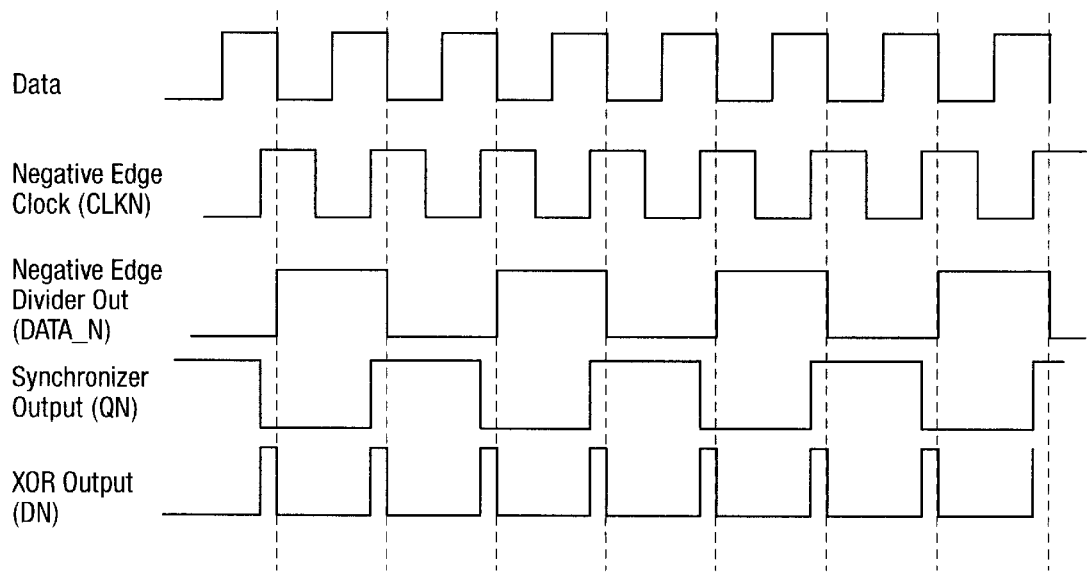

With reference now to FIGS. 9A and 9B, timing diagrams of phase lag are illustrated in which a charge pump decreases charge according to the present invention. If a phase lead is encountered, the UP signal will decrease in duty cycle to less than fifty percent and the DN signal will increase to a duty cycle greater than fifty percent as can be seen in FIGS. 9A and 9B. The change in duty cycle will decrease the amount of charge that is pumped into loop filter, thus adjusting the VCO appropriately to track the data.

Figure 10:
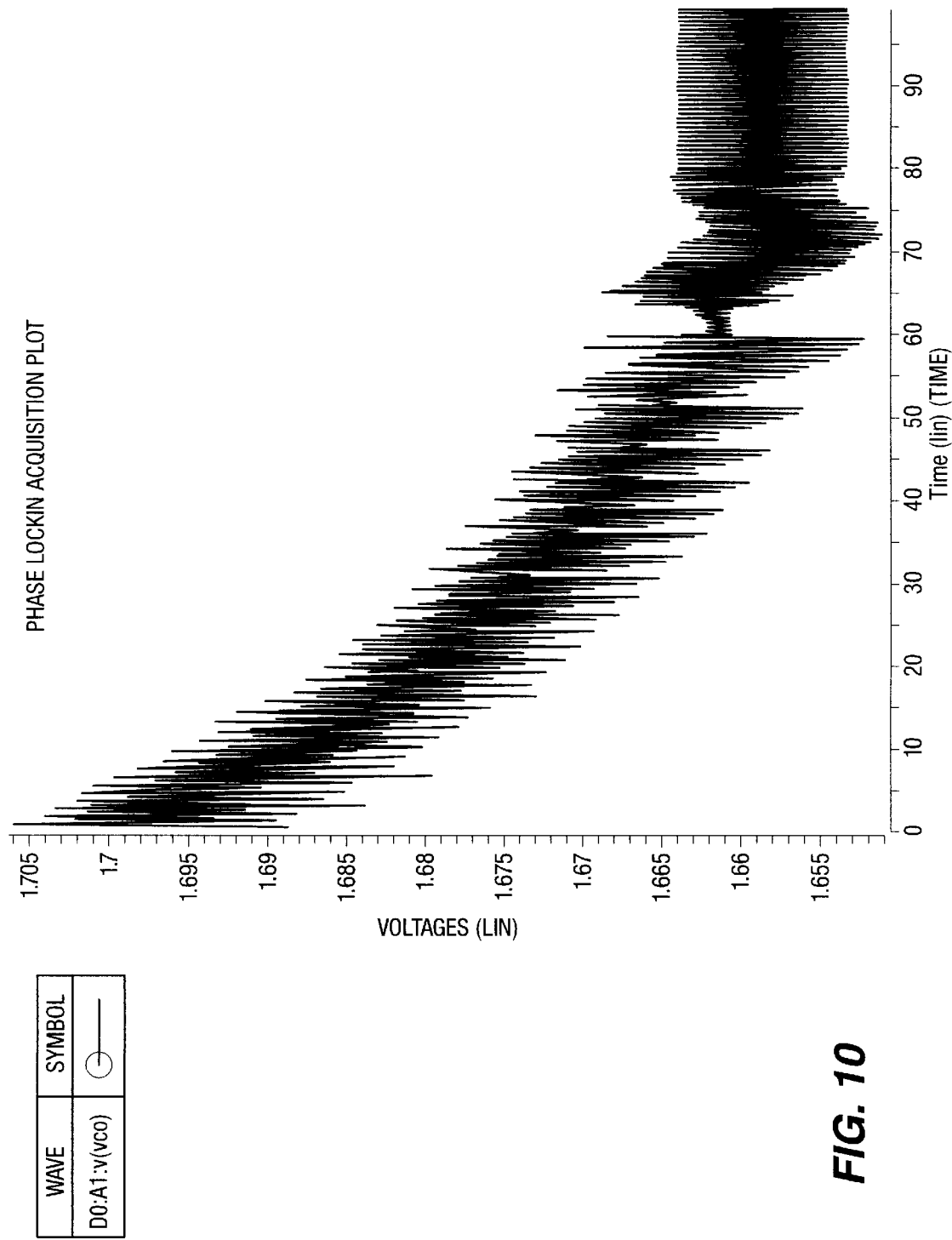
FIG. 10 is a graph of a phase acquisition process depicted according to the present invention.

Next, in FIG. 10, a graph of a phase acquisition process is depicted according to the present invention. This graph was generated from a simulation of PLL 300 from FIG. 3A. A one gigabit data stream was used with a VCO operating at 500 MHz with complimentary clocks. In FIG. 10, lock occurs at around 8 microseconds.

Thus, the present invention provides an advantage over presently available systems because serial data streams may be reduced to slower speeds to reduce the clock rate required for transferring these high speed data streams using the present invention. The present invention reduces the clock rate and allows more latitude to a designer in designing cells including a clock recovery PLL, such as bit synchronizer PLL 116 in receiver 104 from FIG. 1. The present invention provides this advantage by deserializing data prior to processing by a phase detector through the use of complementary dividers such that all data edges are used to perform bit synchronization according to the present invention.

While the invention has been particularly shown and described with reference to a preferred embodiment, it will be understood by those skilled in the art that various changes in form and detail may be made therein without departing from the spirit and scope of the invention.

What is claimed is:

1. A phase-locked loop circuit comprising:
    a divider unit having an input and an output, wherein the divider unit receives serial data at the input and generates parallel data;
    a phase detector unit having a first input, a second input, and an output, wherein the first input of the phase detector unit is connected to the output of the divider unit and receives the parallel data generated by the divider unit; and
    a voltage controlled oscillator having an input and an output, wherein the input of the voltage controlled oscillator is connected to the output of the phase detector unit and the output of the voltage controlled oscillator is connected to the second input of the phase detector unit, wherein the divider unit comprises a first divider and a second divider, wherein the first divider is complementary to the second divider, each divider having an output connected to the phase detector unit, wherein the first divider is a positive edge divider and the second divider is a negative edge divider.

2. A phase-locked loop circuit comprising:
    divider means for receiving serial data and for converting the received serial data into parallel data, wherein a clock rate of the parallel data is less than a clock rate of a serial data and no data edges are lost;

phase detector means, connector to a divider means to receive the parallel data, for producing a signal proportional between the parallel data and an output signal from a voltage controlled oscillator;

a filter having an input and output, the input being connected to the phase connector means to receive the output signal from the phase detector; and the voltage controlled oscillator having an input and an output, the input being connected to the output of the filter and the output being connected to the phase detector means to supply the output signal to the phase detector means, wherein the divider means comprises:
   a first divider having an input and an output, wherein the input is for receiving the serial data stream; and
   a second divider having an input and an output, wherein the input is for receiving the serial data stream and wherein the second divider is a complementary divider to the first divider, wherein the first divider is a positive edge divider and the second divider is a negative edge divider.

3. The phase-locked loop circuit of claim 2, wherein the phase detector means comprises:
   a first phase detector having an input and an output, wherein the input of the first phase detector is connected to the output of the first divider and the output of the first phase detector to the input of the filter; and
   a second phase detector having an input and an output, wherein the input of the second phase detector is connected to the output of the second divider and the output of the second phase detector is connected to the input of the filter.

4. A data transmission system comprising:

a transmitter having an input and output where transmitter receives input parallel data at the input and generates serial data at the output;

a transmission medium having a first end and a second end, wherein the first end is connected to the output of the transmitter and wherein the transmission medium transports the serial data from the first end to the second end; and a receiver including:
   a serial receiver having an input connected to the second end of the transmission medium, wherein the serial receiver receives the serial data from the transmission medium;
   a serial to parallel converter for generating output parallel data from the serial data;
   a phase-locked loop circuit for providing a clock recovery signal for the serial to parallel converter, the PLL including:
      divider means for receiving the serial data and converting the serial data into internal parallel data;
      phase detector means, connected to the divider means to receive the internal parallel data, for producing signals proportional between the internal parallel data and an output signal from a voltage controlled oscillator;
      a filter having an input and an output, the input being connected to the phase detector means; and
      a voltage controlled oscillator having an input and output, the input being connected to the output of the filter and the output provides a signal having a first frequency that is connected to the phase detector means to clock the phase detector means at a frequency substantially equal to the first frequency, the first frequency being less than a clock rate of the serial data, wherein the divider unit comprises a first divider and a second divider, wherein the first divider is complementary to the second divider, each divider having an output connected to the phase detector unit, wherein the first divider is a positive edge divider and the second divider is a negative edge divider.

5. A data transmission system comprising:

a transmitter having an input and output where transmitter receives input parallel data at the input and generates serial data at the output;

a transmission medium having a first end and a second end, wherein the first end is connected to the output of the transmitter and wherein the transmission medium transports the serial data from the first end to the second end; and a receiver including:
   a serial receiver having an input connected to the second end of the transmission medium, wherein the serial receiver receives the serial data from the transmission medium;
   a serial to parallel converter for generating output parallel data from the serial data;
   a phase-locked loop circuit for providing a clock recovery signal for the serial to parallel converter, the phase-locked loop circuit including:
      a divider unit having an input and output, wherein the divider unit receives serial data and generates parallel data;
      a phase detector unit having a first input, a second input, and an output wherein the first input of the phase detector unit is connected to the output of the divider unit and receives the parallel data generated by the divider unit; and
      a voltage controlled oscillator having an input and an output, wherein the input of the voltage controlled oscillator is connected to the output of the phase detector unit and the output of the voltage controlled oscillator provides a signal having a first frequency that is connected to the second input of the phase detector unit to clock the phase detector unit at a frequency substantially equal to the first frequency, and further wherein the first frequency is less than a clock rate of the serial data, wherein the divider unit comprises a first divider and a second divider, wherein the first divider is complementary to the second divider, each divider having an output connected to the phase detector unit, wherein the first divider is a positive edge divider and the second divider is a negative edge divider.

6. A phase-locked loop circuit comprising:

a divider unit having an input and output, wherein the divider unit receives serial data, including data edges, at the input and generates parallel data such that no data edges are lost;

a chase detector unit having a first input, a second input, and an output wherein the first input of the phase detector unit is connected to the output of the divider unit and receives the parallel data generated by the divider unit;

a charge pump unit having an input and output, wherein the input of the charge pump unit is connected to the output of the phase detector unit; and a voltage controlled oscillator having an input and an output, wherein the input of the voltage controlled oscillator is connected to the output of the charge pump unit and the output of the voltage controlled oscillator is connected to the second input of the phase detector unit, wherein the divider unit includes two dividers, a positive edge divider and a negative edge divider, each divider having an input and an output, and the phase detector unit includes a first phase detector and a second phase detector, wherein each phase detector has a first input, a second input, and a output, wherein the first input of the first phase detector is connected to the output of the positive edge divider and the first input of the second phase detector is connected to the output of the negative edge divider, wherein the output of each phase detector is connected to the input of the charge pump, and the second input of each phase detector is connected to the output of the voltage controlled oscillator.

7. The phase-locked loop circuit of claim 6, wherein each phase detector comprises a D-flip flop and an XOR gate, the D-flip flop having a first input connected to the output of the respective divider and a second input connected to the output of the voltage controlled oscillator, and an output connected to a first input of the XOR gate, and wherein the XOR gate having a second input connected to the output of the respective divider and an output connected to the charge pump.

8. A phase-locked loop circuit comprising:
  a divider unit having an input and output, wherein the divider unit receives serial data, including data edges, at the input and generates parallel data such that no data edges are lost;
  a phase detector unit having a first input, a second input, and an output wherein the first input of the phase detector unit is connected to the output of the divider unit and receives the parallel data generated by the divider unit;
  a charge pump unit having an input and output, wherein the input of the charge pump unit is connected to the output of the phase detector unit; and
  a voltage controlled oscillator having an input and an output, wherein the input of the voltage controlled oscillator is connected to the output of the charge pump unit and the output of the voltage controlled oscillator is connected to the second input of the phase detector unit, wherein the divider unit comprises:
    a first level having two dividers, a positive edge divider and a negative edge divider, wherein each divider has an input and an output; and
    a second level having four dividers, a first positive edge divider, a second positive edge divider, a first negative edge divider, and a second negative edge divider, wherein each divider has an input and an output,
    wherein the output of the positive edge divider in the first level is connected to the input of the first positive edge divider and the input of the first negative edge divider in the second level and the output of the negative edge divider in the first level is connected to the input of the second positive edge divider and the input of the second negative edge divider, wherein the input of the positive edge divider and the input of the negative edge divider in the first level receives serial data and the output of the dividers in the second level are connected to the first input of the phase detector unit.

9. A method for recovering a clock signal from a serial data stream comprising:
  receiving the serial data stream at an input of a clock recovery circuit, the serial data stream having a first clock rate;
  dividing the serial data stream into a plurality of parallel data streams by a divider unit comprising a first divider and a second divider, wherein the first divider is complementary to the second divider, wherein the first divider is a positive edge divider and the second divider is a negative edge divider, wherein each data stream within the plurality of parallel data streams has a second clock rate that is slower than the first clock rate;
  sending each parallel data stream within the plurality of parallel data streams to a phase detector unit, wherein the phase detector unit detects a phase difference between each parallel data stream and a reference signal;
  generating a signal proportional to a phase difference between each parallel data stream and said reference signal; and
  sending the proportional signal to a voltage controlled oscillator to generate the reference signal having a clock rate less than the first clock rate.

10. The method of claim 9, wherein the dividing step comprises dividing the serial data stream into two parallel data streams.

11. The method of claim 10, wherein the second clock rate is one-half of the first clock rate.

12. The method of claim 9, wherein the dividing step comprises dividing the serial data stream into four parallel data streams.

13. The method of claim 12, wherein the second clock rate is one-fourth of the first clock rate.

14. The method of claim 9, wherein the dividing step comprises dividing the serial data stream into N parallel data streams.

15. The method of claim 14, wherein the second clock rate has a rate that is 1/N of the first clock rate.

16. The system of claim 5, wherein the phase detector unit includes a charge pump.

* * * * *